(12) United States Patent
Pasad et al.

(10) Patent No.: US 12,375,585 B1
(45) Date of Patent: *Jul. 29, 2025

(54) METHODS AND APPARATUS FOR COMPRESSING DATA STREAMS

(71) Applicant: Marvell Asia Pte, Ltd., Singapore (SG)

(72) Inventors: Kalpendu Ratanshi Pasad, Cupertino, CA (US); Hong Jik Kim, San Jose, CA (US)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 18/382,461

(22) Filed: Oct. 20, 2023

Related U.S. Application Data

(63) Continuation of application No. 17/833,798, filed on Jun. 6, 2022, now Pat. No. 11,811,898, which is a continuation of application No. 16/842,478, filed on Apr. 7, 2020, now Pat. No. 11,368,559.

(60) Provisional application No. 62/841,202, filed on Apr. 30, 2019.

(51) Int. Cl.
*H04L 69/04* (2022.01)
*G06N 7/01* (2023.01)
*H03M 7/30* (2006.01)
*H04L 47/12* (2022.01)

(52) U.S. Cl.
CPC .............. *H04L 69/04* (2013.01); *G06N 7/01* (2023.01); *H03M 7/30* (2013.01); *H04L 47/12* (2013.01)

(58) Field of Classification Search
CPC ........... H04L 69/04; H04L 47/12; G06N 7/01; H03M 7/30
USPC .................................................. 370/229, 230
See application file for complete search history.

(56) References Cited

U.S. PATENT DOCUMENTS

| | | | |
|---|---|---|---|
| 6,188,795 B1 | 2/2001 | Brady et al. | |
| 6,256,608 B1 | 7/2001 | Malvar | |
| 2003/0149701 A1 | 8/2003 | Vicars-Harris | |
| 2004/0161156 A1 | 8/2004 | Matsubara | |
| 2004/0202374 A1 | 10/2004 | Venkataraman | |
| 2014/0016688 A1* | 1/2014 | Venkataramani | H04L 27/01 375/232 |

* cited by examiner

*Primary Examiner* — Obaidul Huq
(74) *Attorney, Agent, or Firm* — JW Law Group; James M. Wu

(57) ABSTRACT

Methods and apparatus for enhancing network data processing using compressing data streams are disclosed. The process, in one aspect, is configured to receive a data stream through a receiver via a communication network. Upon identifying compressed data and an encoder identifier carried by the data stream, a decoder database is determined in the receiver. After retrieving a decoder from the decoder database in response to the encoder identifier, the process is configured to decompress the compressed data facilitated by the decoder for generating scaler data.

40 Claims, 5 Drawing Sheets

METHODS AND APPARATUS FOR COMPRESSING DATA STREAMS

PRIORITY

This patent application is a continuation patent application of a U.S. application having a U.S. application Ser. No. 17/833,798, filed on Jun. 6, 2022 in the name of the same inventor and entitled "Methods and Apparatus for Compressing Data Streams," issued into a U.S. patent with a U.S. Pat. No. 11,811,898 on Nov. 7, 2023, which is a continuation of US Application having a U.S. patent application Ser. No. 16/842,478, filed on Apr. 7, 2020 in the name of the same inventor and entitled "Methods and Apparatus for Compressing Data Streams," issued into a U.S. patent with a U.S. Pat. No. 11,368,559 on Jun. 21, 2022, which further claims the benefit of priority from U.S. Provisional Application No. 62/841,202, filed on Apr. 30, 2019, and entitled "Method and Apparatus for Compressing Incoming Data Steam Using A Compression Engine for A Hardware Accelerator Block," all of which are hereby incorporated herein by reference in their entirety.

FIELD

The exemplary embodiments of the present invention relate to data transmission. More specifically, the exemplary embodiments of the present invention relate to compressing and decompressing data streams for data transmission.

BACKGROUND

With the rapidly growing trend of mobile and remote data access over high-speed communication networks, such as LTE or 5G cellular services, accurately delivering and deciphering data streams has become increasingly challenging and difficult. High-speed communication networks, which are capable of delivering information include, but are not limited to, wireless networks, cellular networks, wireless personal area network ("WPAN"), wireless local area networks ("WLAN"), and wireless metropolitan area networks ("WMAN").

The problems and concerns of data transmission are not restricted to data transmission over wired or wireless system interconnects, but even extend to the transmission of data over interconnects between circuitry on one integrated circuit or system-on-chip (SoC) device. As data rates increase and the volume of data that flows over system interconnects increases, systems to efficiently transmit data are becoming increasing important.

Therefore, it is desirable to have a mechanism that can be used to efficiently transmit data over system interconnects.

SUMMARY

In various embodiments, methods and apparatus are provided for compressing and decompressing data for transmission over system interconnects. For example, a data compression accelerator ("DCA") is provided that implements data compression to reduce traffic over system interconnects. The methods and apparatus can also be used to compress data for transmission over wired or wireless connections. At a receiver that receives the compressed data, an identifier is received with the compressed data that is used to identify a type of decompression to be used to recover the original data. Thus, efficient data transmission over system interconnects is achieved.

In one embodiment, the data compression accelerator is capable of processing and compressing incoming information to be transmitted over a wireless communications network. Upon receiving an information stream, a probability distribution function ("PDF") associated with the information stream is computed. After matching the PDF to a set of predefined PDFs (templates) stored in a local memory, a closest matching PDF is selected from the set of predefined PDFs. In one aspect, an encoder associated with the closest matching PDF is used to compress (encode) the information stream. The encoded stream and an identifier identifying the encoder are transmitted to a receiving circuit or device. The receiving circuit or device uses the encoder identifier to identify a decoder to be used to decompress the encoded stream.

In an embodiment, a method is provided for encoding information. The method includes calculating a probability distribution function (PDF) for scaler data, matching the PDF to PDF templates to determine a closest matching PDF template, and determining an encoder corresponding to the closest matching PDF template, such that a corresponding encoder identifier is determined. The method also includes encoding the scaler data with the encoder to generate an encoded stream, and transmitting the encoded stream and the encoder identifier. In an aspect, the encoder is an entropic encoder that provides lossless data compression. For example, one type of entropic encoder creates and assigns a unique prefix-free code to each unique symbol that occurs in the input. Then, the data is compressed by replacing each fixed-length input symbol with the corresponding variable-length prefix-free output codeword. The length of each codeword is approximately proportional to the negative logarithm of the probability. Therefore, the most common symbols use the shortest codes.

In an embodiment, a method is provided for encoding vector information. The method comprises binning received vector data into a plurality of bins, determining a centroid for each bin, forming a dictionary of centroids, counting data vectors in each bin to construct a probability distribution function (PDF) of centroids, and matching the PDF of centroids to PDF templates to determine a closest matching PDF template. The method also comprises determining an encoder corresponding to the closest matching PDF template such that a corresponding encoder identifier is identified, quantizing vectors to the centroids using vector tags, encoding vector tags with the encoder to generate an encoded data stream, and transmitting the encoded stream, the encoder identifier, and the dictionary. In an aspect, the encoder is an entropic encoder that provides lossless data compression.

In an embodiment, an apparatus for encoding information is provided that comprises a probability distribution function (PDF) computation circuit that calculates a PDF associated with input data, a matching circuit that matches the PDF to PDF templates to determine a closest matching PDF template, and determines an encoder corresponding to the closest matching PDF template wherein a corresponding encoder identifier is determined. The apparatus also comprises an encoding circuit that encodes input data with the encoder to generate an encoded stream, and transmits the encoded stream and the encoder identifier.

Additional features and benefits of the exemplary embodiments of the present invention will become apparent from the detailed description, figures, and claims set forth below.

BRIEF DESCRIPTION OF THE DRAWINGS

The exemplary aspects of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
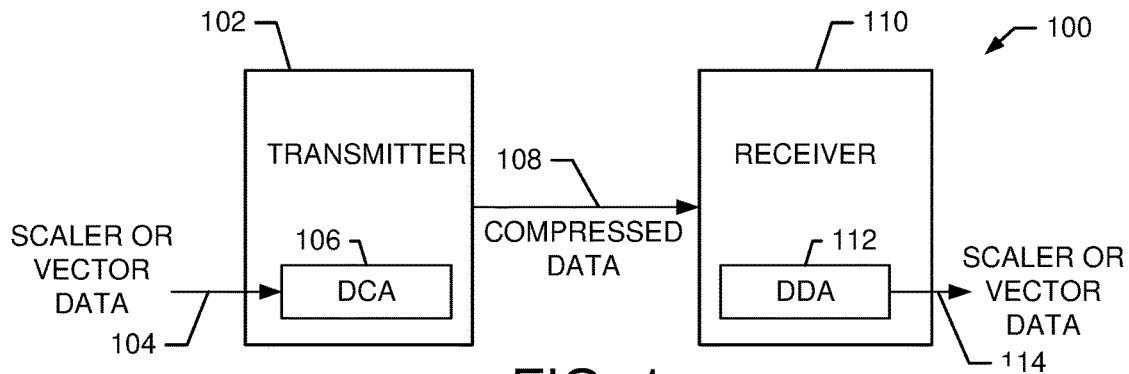
FIG. 1 shows a communication network having a transmitter that includes an exemplary embodiment of a data compression accelerator and a receiver that includes an exemplary embodiment of a data decompression accelerator that provide efficient transmission of scaler or vector data over system interconnects.

In various embodiments, methods and apparatus are provided for efficiently compressing and decompressing scalar or vector data streams. The purpose of the following detailed description is to provide an understanding of one or more embodiments of the present invention. Those of ordinary skills in the art will realize that the following detailed description is illustrative only and is not intended to be in any way limiting. Other embodiments will readily suggest themselves to such skilled persons having the benefit of this disclosure and/or descriptions.

In the interest of clarity, not all of the routine features of the implementations presented herein are shown and described. It will, of course, be understood that in the development of any such actual implementation, numerous implementation-specific decisions may be made in order to achieve the developer's specific goals, such as compliance with application and business-related constraints, and that these specific goals will vary from one implementation to another and from one developer to another. Moreover, it will be understood that such a development effort might be complex and time-consuming, but would nevertheless be a routine undertaking of engineering for those of ordinary skills in the art having the benefit of embodiments of this disclosure.

Various embodiments of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus (e.g., device) or method. The same reference indicators will be used throughout the drawings and the following detailed description to refer to the same or like parts.

The term "system" or "device" is used generically herein to describe any number of components, elements, sub-systems, devices, packet switch elements, packet switches, access switches, routers, networks, modems, base stations, eNB (eNodeB), computer and/or communication devices or mechanisms, or combinations of components thereof. The term "computer" includes a processor, memory, and buses capable of executing instruction wherein the computer refers to one or a cluster of computers, personal computers, workstations, mainframes, or combinations of computers thereof.

FIG. 1 shows a communication network 100 having a transmitter 102 that includes an exemplary embodiment of a data compression accelerator (DCA) 106 and a receiver 110 that includes an exemplary embodiment of a data decompression accelerator (DDA) 112 that provide efficient data transmission of scaler or vector data over system interconnects.

In various exemplary embodiments, compression and decompression methods and apparatus described herein are extended to either scalar or vector data streams. This is particularly useful in (but not limited to) baseband modem applications (wireless and wireline) where data arrives from multiple antennas. Correlations in vectorized data offer a potential for a much higher degree of compression.

During operation, scaler or vector data 104 is received at the transmitter 102 for transmission to the receiver 110. The DCA 106 compresses the scaler or vector data 104 in accordance with embodiments of the invention to generate compressed data 108 that is transmitted to the receiver 110. The DDA 112 operates to reverse the processes performed at the DCA 106 to decompress the received compressed scaler or vector data 108 to recover the original data stream 114. Detailed descriptions of the design and operation of the DCA 106 and the DDA 112 are provided below.

Figure 2:
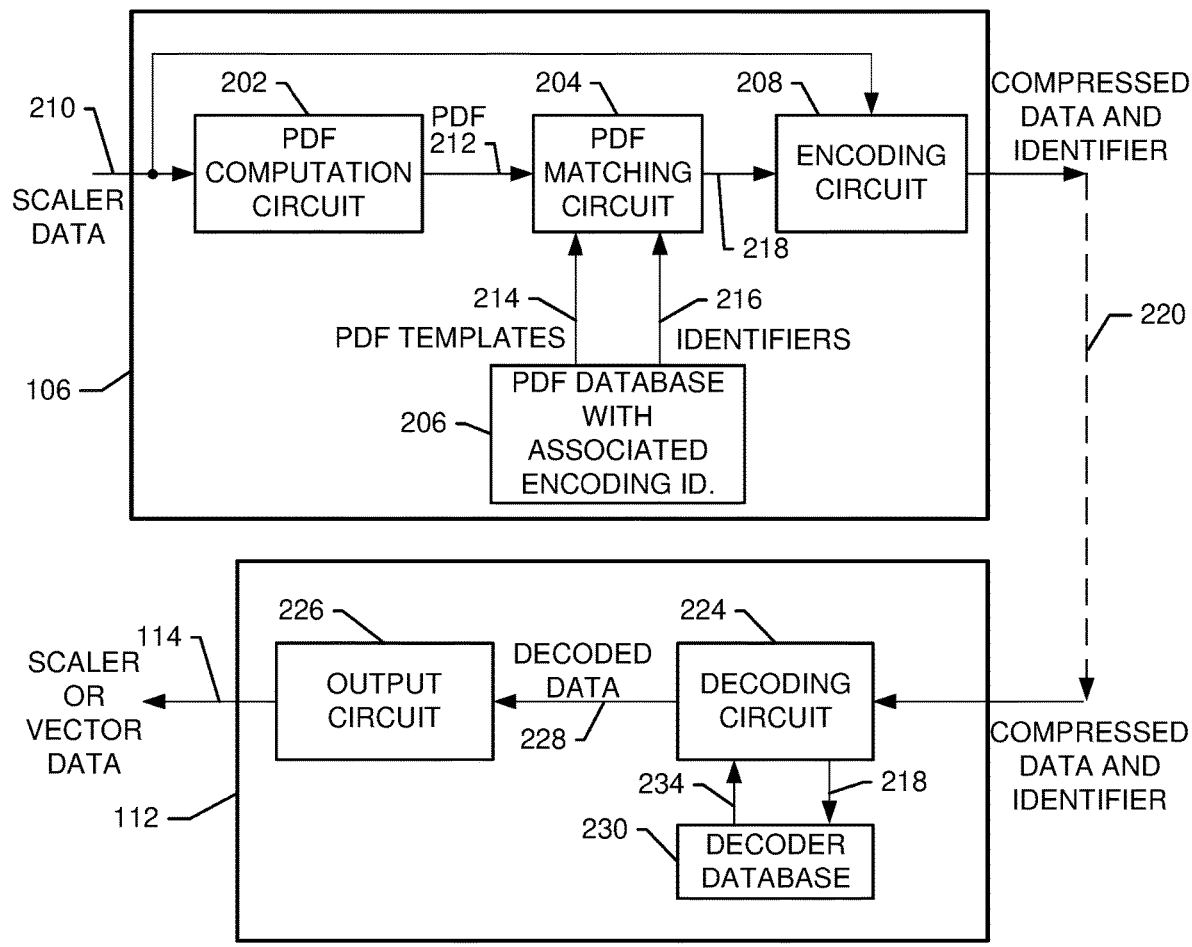
FIG. 2 shows exemplary detailed embodiments of the data compression accelerator and data decompression accelerator shown in FIG. 1.
Figures 3, 4:
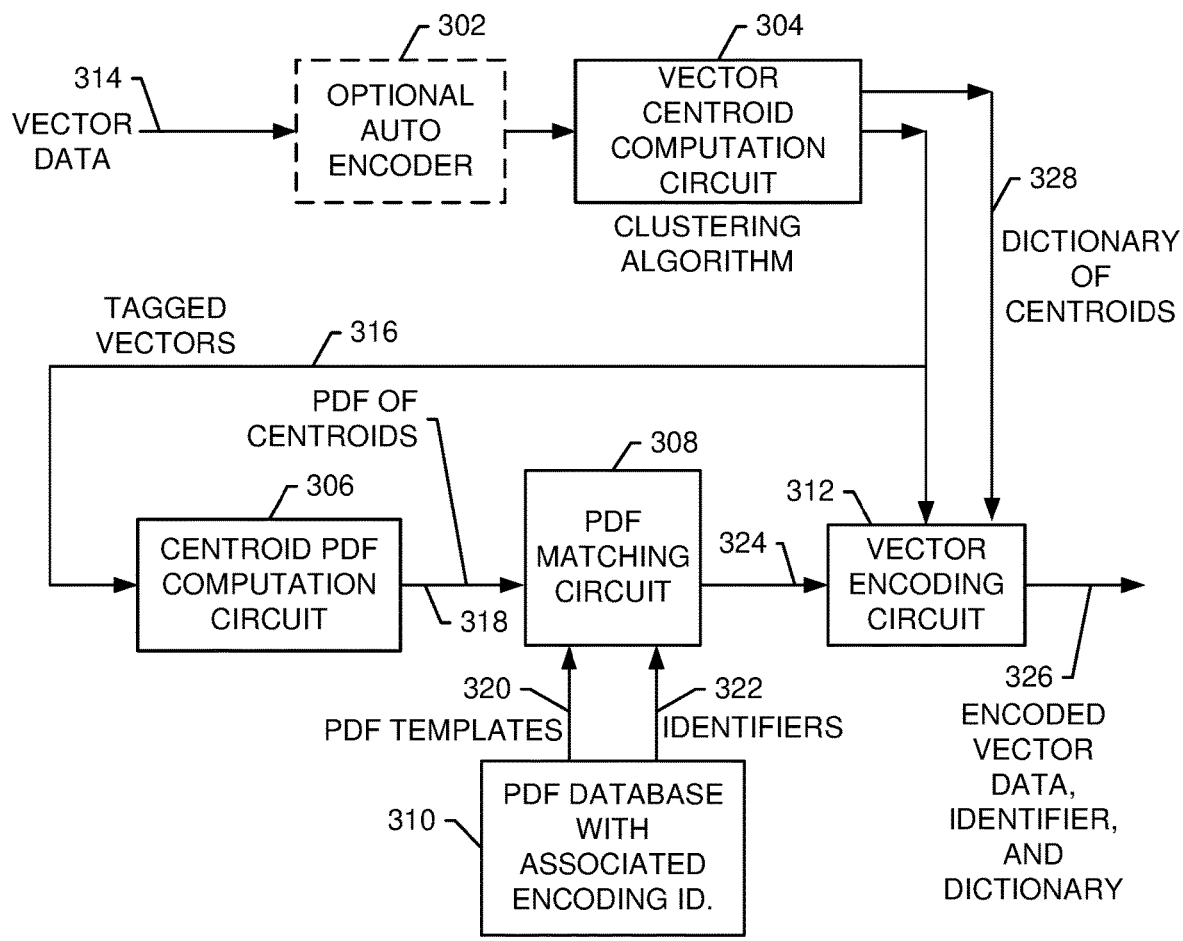
FIG. 3 shows an exemplary alternative embodiment of the data compression accelerator of FIG. 2 that is configured to encode vector data.
FIG. 4 shows an exemplary embodiment of PDF templates associated with scaler and vector data.

FIG. 2 shows exemplary detailed embodiments of the DCA 106 and the DDA 112 shown in FIG. 1. The embodiments shown in FIG. 2 provide data compression, transmission, and decompression for scaler data. FIG. 3 illustrates embodiments that provide data compression for vector data. For simplicity the DDA 112 shown in FIG. 2 will be used to describe the receipt and decompression of both scaler and vector data.

Referring now to FIG. 2, the DCA 106 comprises PDF computation circuit 202, PDF matching circuit 204, PDF database 206, and encoding circuit 208. In an embodiment, the DDA 112 comprises decoding circuit 224, decoder database 230, and output circuit 226. Each of the functional blocks of the DCA 106 and the DDA 112 comprises hardware and algorithms that are selected to minimize latency and memory requirements. For example, the PDF computation circuit 202 may perform a simplified PDF computation by using partial and/or historical data.

During operation, the PDF computation circuit 202 receives scaler data 210 and calculates a probability distribution function 212 for the received scaler data 210. The PDF 212 is input to the PDF matching circuit 204. The PDF matching circuit 204 receives the PDF 212 and matches this PDF with PDF templates 214 that are stored in the PDF database 206. The PDF templates 214 are associated with encoding identifiers 216. In an embodiment, the encoding identifiers 216 associate a specific entropic encoder for the selected PDF template. The PDF matching circuit 204 determines one of the PDF templates 214 that best matches the computed PDF 212. Determining the best matching can be done using any desired criteria and with respect to the specific implementation. Once the best matching PDF template is found, the encoding identifier 218 associated with the best matching PDF template is passed to the encoding circuit 208.

The encoding circuit 208 receives the scaler data 210 and applies the type of encoding identified by the encoding identifier 218 to generate compressed data. For example, the encoding circuit 208 uses entropic coding, such as Huffman coding. The combination 220, which includes the compressed (or encoded) data and the identifier 218, is then transmitted to the receiving circuit that includes the DDA 112. For example, the transmission may be a wired or wireless transmission.

In an embodiment, the DDA 112 receives the combination 220 of the compressed data and encoder identifier 218 at the decoding circuit 224. The decoding circuit 224 uses the identifier 218 to access the decoder database 230 to obtain a decoder 234 to be used to decompress the received compressed data. The decoder circuit 224 outputs decompressed (decoded) data 228 that is passed to the output circuit 226. The output circuit 226 performs any final processing and passes the recovered scaler or vector data 114 to other entities at the receiver.

In various exemplary embodiments, the disclosed methods and apparatus compress incoming data quickly before transmission to another processing block or device, and the compressed data can be subsequently decompressed quickly at that next processing block or device. In an aspect, the DCA 106 compresses scalar data for transmission by performing one or more of the following operations.

1. Calculating a probability distribution function (PDF) for the incoming scaler data.
2. Matching the calculated PDF to PDF templates stored in a database. For example, the matching may be performed using KL (Kullback-Leibler) divergence or other suitable function to determine the closest matching PDF template.
3. Selecting the closest matching PDF template.
4. Determining an encoder (such as an entropic encoder) associated with the closest matching PDF template. The best matching PDF template has an associated encoder identifier that is also stored in the database that identifies the entropic encoder.
5. Encoding the scaler data stream with the entropic encoder to generate an encoded data stream.
6. Transmitting the encoded data stream and encoder identifier to another processing block or device.
7. Receiving the encoded stream and encoder identifier at the processing block or device and decoding the encoded stream using a decoder identified by the encoder identifier.

FIG. 3 shows an exemplary alternative embodiment of a DCA 300 that is configured to compress vector data. The DCA 300 comprises an optional auto encoder 302, vector centroid computation circuit 304, centroid PDF computation circuit 306, PDF matching circuit 308, PDF template database 310, and vector encoding circuit 312.

During operation, vector data 314 is received at the optional auto encoder 302 or is passed directly to the vector centroid computation circuit 304. When processed by the auto-encoder 302, the vector data is reduced in dimension by an encoder portion of the auto-encoder 302. The auto-encoder is typically implemented as a pre-trained neural network that processes input vectors into lower dimensional vectors.

The vector centroid computation circuit 304 clusters (or bins) the vector data to determine centroids for the bins and tags the vectors with corresponding centroid identifiers to generate tagged vectors 316 that are passed to the centroid PDF computation circuit 306. For example, in an embodiment, the vector centroid computation circuit 304 utilizes a clustering algorithm to find clusters of vectors. Clustering is a method of vector quantization that partitions n observations into k clusters in which each observation belongs to the cluster with the nearest mean, serving as a prototype of the cluster. In an aspect, the clustering algorithm, is a K-means clustering algorithm. The determined centroids are entered into a dictionary 328 that identifies each centroid and associates various parameters and values with each centroid. The dictionary of centroids 328 is passed to the vector encoding circuit 312.

The centroid PDF computation circuit 306 counts the number of vectors associated with each centroid to calculate a PDF of centroids 318. The PDF 318 is input to the PDF matching circuit 308. The PDF matching circuit 308 receives the PDF 318 and matches this PDF with PDF templates 320 that are stored in the PDF database 310. The PDF templates 320 are associated with encoding identifiers 322 that are also stored in the database 310. Each identifier identifies a type of entropic encoder associated with a particular PDF template. The PDF matching circuit 308 determines the PDF template that best matches the computed PDF 318 and passes the corresponding encoder identifier 324 to the vector encoding circuit 312. The vector encoding circuit 312 receives the tagged (or quantized) vectors 316 and applies the selected type of encoding identified by the encoding identifier 324 to compress the vector tags. The combination 326, which includes the compressed vector tag data, the encoder identifier 324, and the centroid dictionary 328 is then transmitted to a receiving block or device that includes a decompression circuit, such as the DDA 112. The decompression circuit decompresses the compressed data stream as described above, for example, as described with reference to FIG. 2.

In one aspect, the DCA 300 compresses vector data for transmission by performing one or more of the following operations.

1. Optionally applying an auto-encoder to vector data to reduce a dimension of the vector data and further facilitate the convergence of clustering.
2. Performing vector centroid computation to bin the vector data. For example, K-means clustering can be performed to determine the centroids for the bins. A centroid dictionary is formed from the determined centroids.
3. Tagging (or quantizing) each vector into its corresponding centroid.
4. Performing a centroid PDF computation to construct a PDF of centroids. For example, the number of vectors in each centroid are counted to construct a PDF of centroids.
5. Matching the PDF of centroids to PDF templates stored in a database. For example, the matching may be performed using KL (Kullback-Leibler) divergence or other suitable function.
6. Selecting the closest matching PDF template.
7. Determining an entropic encoder corresponding to the closest matching PDF template. For example, the entropic encoder has an associated encoder identifier that identifies the encoder.
8. Encoding the quantized tagged vector data with the identified entropic encoder to generate and encoded data stream.
9 Transmitting the encoded data stream, encoder identifier, and the centroid dictionary to a receiver. For example, the transmission may be either a wired or wireless transmission.

FIG. 4 shows exemplary embodiments of scaler 402 and vector 404 PDF templates that are stored with associated encoder identifiers. For example, the scaler PDF templates are stored with scaler encoder identifiers ($SID_N$) and the vector PDF templates are stored with vector encoder identifiers ($VID_K$).

Figure 5:
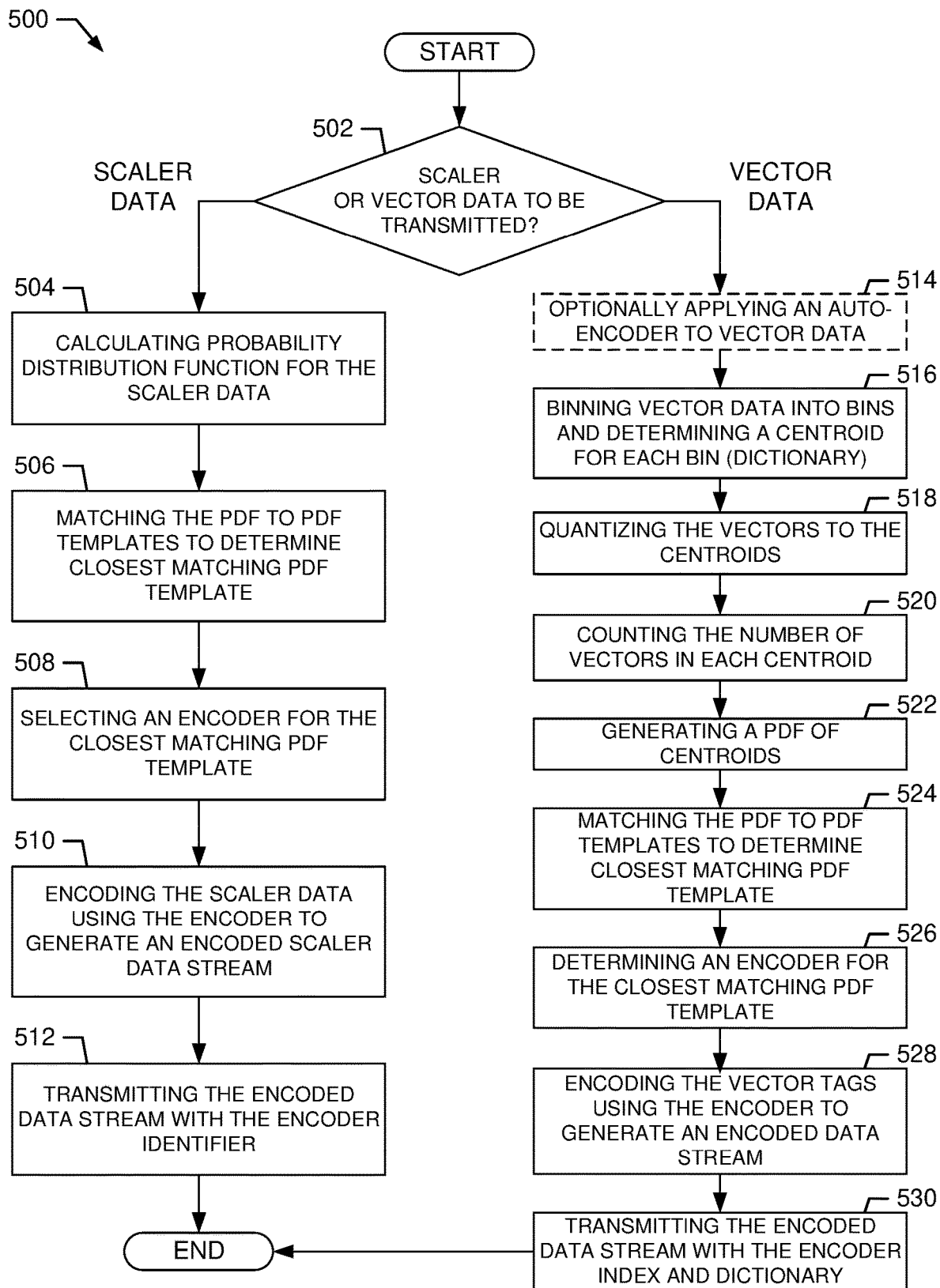
FIG. 5 shows an exemplary method for data compression of scaler or vector data to be transmitted over a system interconnect.

FIG. 5 shows an exemplary method 500 for data compression of scaler or vector data to be transmitted over a system interconnect. For example, the method 500 is suitable for use with the DCA 106 shown in FIG. 2 and the DCA 300 shown in FIG. 3.

At block 502, a determination is made as to whether data to be transmitted is scaler or vector. If the data is scaler data, the method proceeds to block 504. If the data is vector data, the method proceeds to block 514.

At block 504, a probability distribution function is calculated for the scaler data. For example, the PDF computation circuit 202 calculates the PDF 212 for received scaler data 210.

At block 506, the calculated PDF is matched with stored PDF templates to determine the closest matching PDF template. For example, the PDF matching circuit 204 matches the PDF 212 to PDF templates 214 stored in the database 206.

At block 508, an encoder associated with the closest matching PDF template is selected. In an embodiment, the encoder is an entropic encoder. For example, the PDF matching circuit 204 determines the closest matching PDF template and also determines an encoder identifier 218 associated and stored with the closest matching PDF template. The encoder identifier 218 is passed to the encoding circuit 208.

At block 510, the scaler data is compressed using the determined encoder. For example, the encoding circuit 208 compresses the scaler data 210 using the encoder identified by the encoder identifier 218.

At block 512, the encoded data is transmitted along with the encoder identifier. For example, the encoding circuit 208 transmits the combination 220, which comprises the encoded (compressed) data and the encoder identifier. After this operation, the method 500 ends.

At block 514, an auto-encoder is optionally applied to the vector data. The encoder portion of the auto-encoder reduces the dimension of the vector data. The auto-encoder is typically implemented as a pre-trained neural network.

At block 516, the vector data is binned into bins and a centroid for each bin is determined. For example, the vector centroid computation circuit 304 performs these operations using a clustering algorithm to find the centroids for the bins. The determined centroids are maintained in a dictionary that identifies each centroid and associates various parameters and values with each centroid. For example, the vector centroid computation circuit 304 forms and maintains the dictionary of centroids 328.

At block 518, the vectors are quantized to the centroids. For example, the vector centroid computation circuit 304 quantizes the number of vectors in each centroid. For example, in an aspect, an operation of quantizing the vectors to the centroids is performed by representing the vector by the index (or tag) of the cluster to which the vector belongs.

At block 520, the number of vectors in each centroid are counted and output as tagged vectors 316 that are tagged with their associated centroid.

At block 522, a PDF of centroids is generated. For example, the vector PDF computation circuit 306 computes the PDF 318 from the tagged vectors 316.

At block 524, the computed PDF is matched to PDF templates to determine the closest matching PDF template. For example, the vector PDF matching circuit 308 matches the PDF 318 to the PDF templates stored in the database 310. A closest matching PDF template is determined.

At block 526, an encoder associated with the closest matching PDF template is determined. For example, the PDF matching circuit 308 retrieves an encoder identifier 324 associated with the closest matching PDF template that is stored in the database 310. The encoder identifier 324 identifies an encoder to be used to encode the vector data.

At block 528, the vector tags are encoded (compressed) using the determined encoder to generate an encoded data stream. For example, the vector encoding circuit 312 encodes the vector tags with the encoder identified by the encoder identifier 324 to generate the encoded data stream.

At block 530, the encoded data stream is transmitted along with the encoder identifier and the centroid dictionary as indicated at 326. The method then ends.

Thus, the method 500 operates to compress scaler or vector data to be transmitted over a system interconnect. It should be noted that the operations of the method 500 are exemplary and that changes, modifications, additions, and deletions may be made within the scope of the embodiments.

Figure 6:
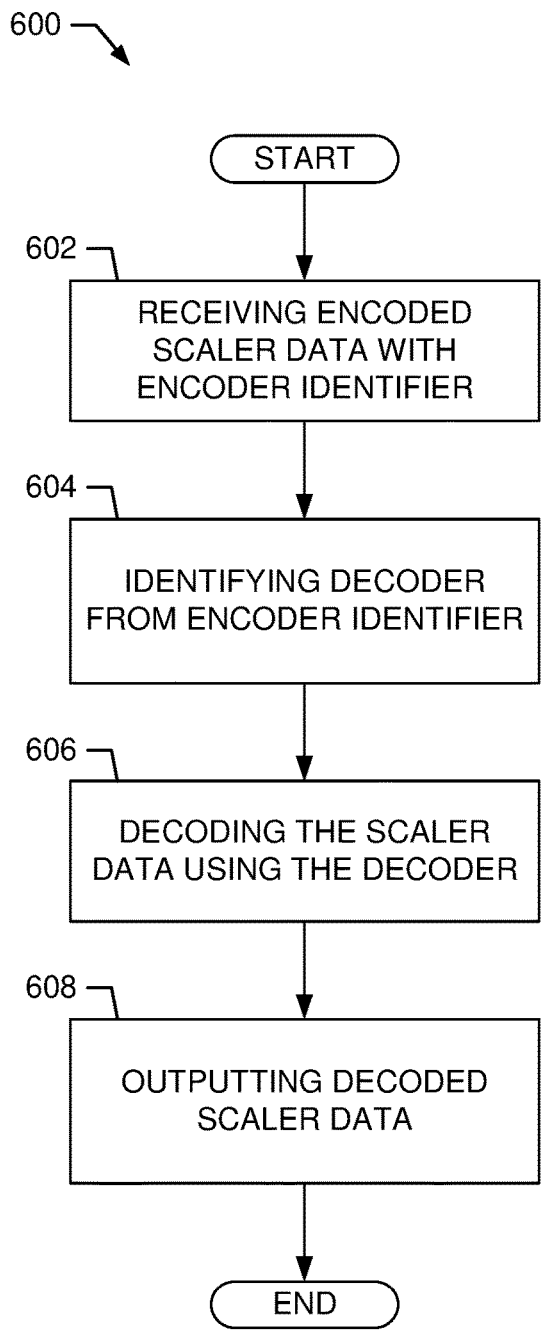
FIG. 6 shows an exemplary method for data decompression of scaler data received over a system interconnect.

FIG. 6 shows an exemplary method 600 for data decompression of scaler data received over a system interconnect. For example, the method 600 is suitable for use with the DDA 112 shown in FIG. 2.

At block 602, scaler data with a corresponding encoder identifier is received. For example, the scaler data and the encoder identifier are received by the decoding circuit 224.

At block 604, a decoder is identified using the encoder identifier. For example, the decoding circuit 224 uses the encoder identifier to access the stored decoders in decoder database 230 to obtain the decoder 234.

At block 606, the scaler data is decoded using the decoder. For example, the decoding circuit 224 decodes the received compressed scaler data using a decoder 234 identified by the encoder identifier.

At block 608, the decoded data is output. For example, the decoded data 228 is passed to the output circuit 226 which outputs the decoded data as the original scaler data 210.

Thus, the method 600 operates to decode received scaler data. It should be noted that the operations of the method 600 are exemplary and that changes, modifications, additions, and deletions may be made within the scope of the embodiments.

Figure 7:
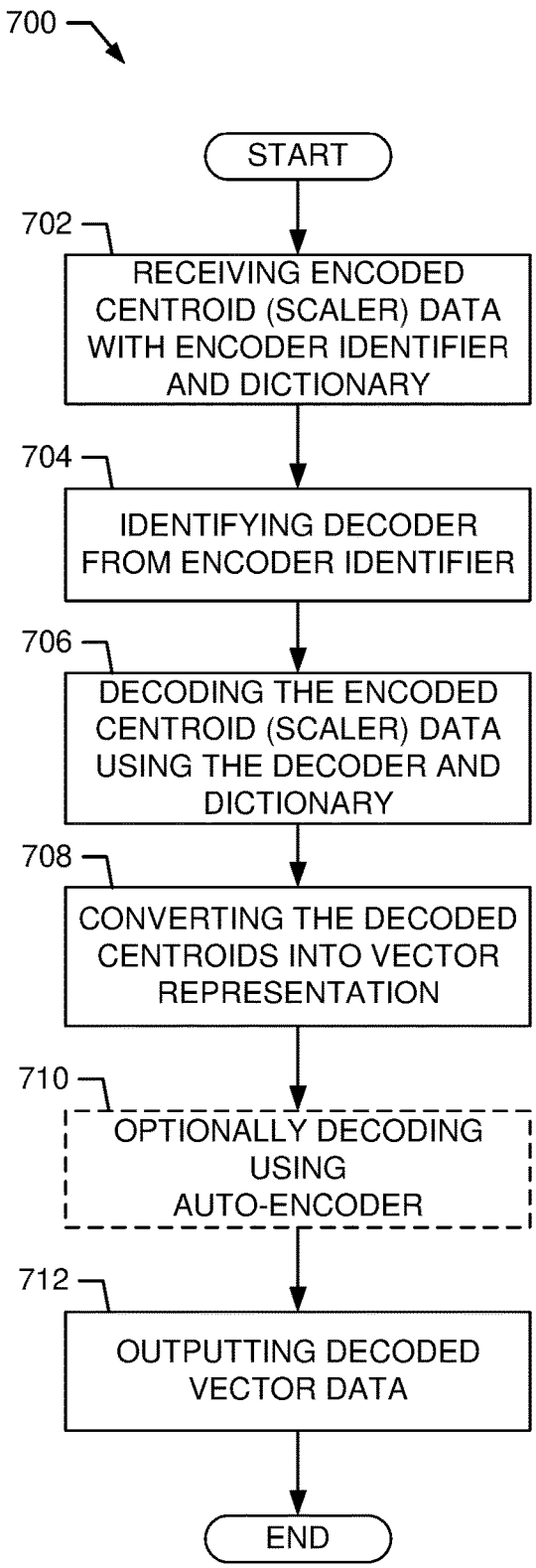
FIG. 7 shows an exemplary method for data decompression of vector data received over a system interconnect.

FIG. 7 shows an exemplary method 700 for data decompression of vector data received over a system interconnect. For example, the method 700 is suitable for use with the DDA 112 shown in FIG. 2.

At block 702, encoded centroid data with a corresponding encoder identifier and centroid dictionary is received. In an embodiment, the encoded data is in the form of scaler data. For example, the encoded centroid data and the encoder identifier are received by the decoding circuit 224.

At block 704, a decoder is determined using the encoder identifier. For example, the decoding circuit 224 uses the encoder identifier to access the stored decoders in decoder database 230 to determine the decoder 234.

At block 706, the encoded centroid data is decoded using the decoder. For example, the decoding circuit 224 decodes the received encoded centroid data using the received dictionary and the decoder 234 determined from the encoder identifier.

At block 708, the decoded centroids are converted into a vector representation. For example, the decoding circuit 224 converts the decoded centroids into a vector representation.

At block 710, an optional operation is performed wherein the vector representation is decoded using a decoding part of an auto-encoder. The decoding part of the auto-encoder restores the dimensionality of the vector data. For example, the decoding circuit 224 performs this optional operation.

At block 712, the decoded vector data is output. For example, the decoded data 228 is passed to the output circuit 226, which outputs the decoded data as the original vector data 114.

Thus, the method 700 operates to decode received vector data. It should be noted that the operations of the method 700 are exemplary and that changes, modifications, additions, and deletions may be made within the scope of the embodiments.

Figure 8:
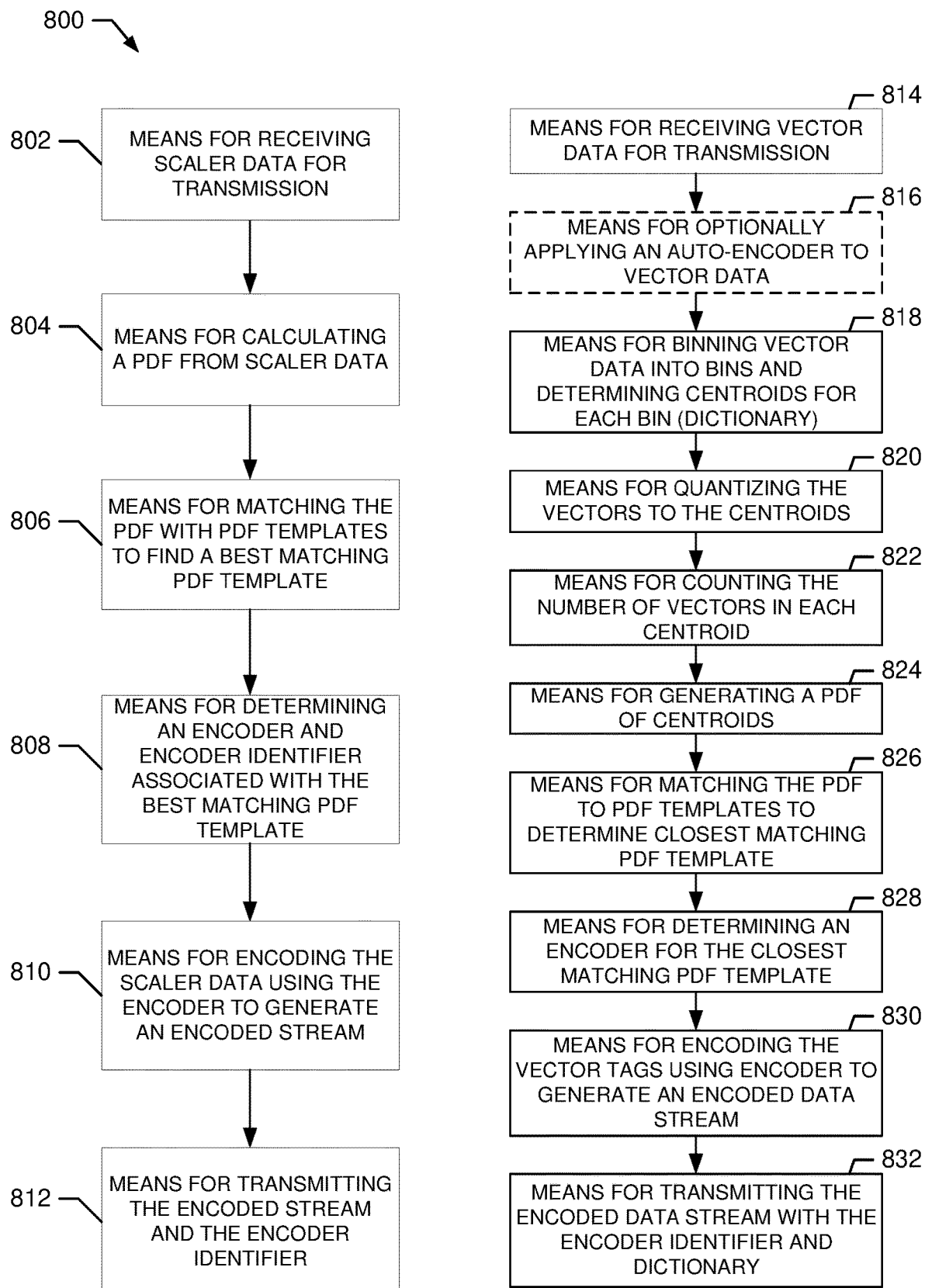
FIG. 8 shows an exemplary apparatus for compression of scaler or vector data.

FIG. 8 shows an exemplary apparatus 800 for data compression of scaler or vector data in accordance with exemplary embodiments of the invention.

The apparatus comprises means (802) for receiving scaler data for transmission, which in an embodiment comprises the PDF computation circuit 202. The apparatus also comprises means (804) for calculating a PDF from received scaler data, which in an embodiment comprises the PDF computation circuit 202. The apparatus also comprises means (806) for matching the PDF with PDF templates to find a best matching PDF template, which in an embodiment comprises the PDF matching circuit 204. The apparatus also comprises means (808) for determining an encoder and encoder identifier associated with the best matching PDF template, which in an embodiment comprises the PDF matching circuit 204. The apparatus also comprises means (810) for encoding the scaler data using the encoder to generate an encoded stream, which in an embodiment comprises the encoding circuit 208. The apparatus also comprises means (812) for transmitting the encoded stream and the encoder identifier, which in an embodiment comprises the encoding circuit 208.

In an embodiment, the apparatus also comprises means (814) for receiving vector data for transmission, which in an embodiment comprises the vector centroid computation circuit 304. The apparatus also comprises means (816) for optionally applying an auto-encoder to the vector data, which in an embodiment comprises the auto-encoder 302. The apparatus also comprises means (818) for binning vector data into bins and determining centroids for each bin and a centroid dictionary, which in an embodiment comprises the vector centroid computation circuit 304. The apparatus also comprises means (820) for quantizing the vectors to the centroids, which in an embodiment comprises the vector centroid computation circuit 304. The apparatus also comprises means (822) for counting the number of vectors in each centroid, which in an embodiment comprises the vector centroid computation circuit 304. The apparatus also comprises means (822) for generating a PDF of centroids, which in an embodiment comprises the vector PDF computation circuit 306. The apparatus also comprises means (824) for matching the PDF to PDF templates to determine a closest matching PDF template, which in an embodiment comprises the PDF matching circuit 308. The apparatus also comprises means (826) for determining an encoder associated with the closest matching PDF template, which in an embodiment comprises the PDF matching circuit 308. The apparatus also comprises means (830) for encoding the vector tags using an encoder to generate an encoded data stream, which in an embodiment comprises the vector encoding circuit 312. The apparatus also comprises means (832) for transmitting the encoded data stream with the encoder identifier and the centroid dictionary, which in an embodiment comprises the vector encoding circuit 312.

While particular embodiments of the present invention have been shown and described, it will be obvious to those skilled in the art that, based upon the teachings herein, changes and modifications may be made without departing from these exemplary embodiments of the present invention and its broader aspects. Therefore, the appended claims are intended to encompass within their scope all such changes and modifications as are within the true spirit and scope of these exemplary embodiments of the present invention.

What is claimed is:

1. A method for data processing via a wireless network communication, comprising:
   receiving a data stream of compressed data and an encoder identifier by a receiver via one of fifth and higher generation of wireless communication networks;
   determining a decoder database storing multiple decoders in the receiver;
   retrieving a decoder from the decoder database in response to the encoder identifier; and
   decompressing the compressed data facilitated by the decoder for generating scalar data.

2. The method of claim 1, further comprising transmitting the data stream containing scalar data in a compressed format and the encoder identifier.

3. The method of claim 1, wherein determining a decoder includes determining an entropic decoder corresponding to the encoder identifier.

4. The method of claim 1, further comprising computing a probability distribution function ("PDF") for scalar data.

5. The method of claim 1, further comprising obtaining a plurality of probability distribution function ("PDF") templates from a PDF database.

6. The method of claim 1, further comprising matching a probability distribution function ("PDF") to PDF templates using KL (Kullback-Leibler) divergence to determine a closest matching PDF template.

7. The method of claim 6, wherein matching the PDF to the PDF templates includes accessing a database to obtain the PDF templates.

8. The method of claim 1, further comprising determining an encoder corresponding to a closest matching probability distribution function ("PDF") template in response to a corresponding encoder identifier.

9. The method of claim 1, further comprising encoding scalar data to generate the data stream.

10. The method of claim 1, wherein determining an encoder includes determining an entropic encoder corresponding to closest matching probability distribution function ("PDF") template.

11. The method of claim 1, further comprising transmitting the data stream includes sending compressed data streams and the encoder identifier over a wired link.

12. The method of claim 1, further comprising transmitting the data stream includes sending compressed data streams and the encoder identifier over a wireless link.

13. An apparatus for facilitating network communication, comprising:
   a receiver configured to receive compressed data and an encoder identifier via one of fifth and higher generation of wireless communication networks;

a decoder database, coupled to the receiver, containing a plurality of decoders configured to facilitate decompressing compressed data;

a decoding circuit, coupled to the decoder database, configured to receive the compressed data and encoder identifier and configured to retrieving a decoder from the decoder database in response to the encoder identifier; and an output circuit coupled to the decoding circuit and configured to provide scalar data generated via a decompressing process in response to the decoder.

14. The apparatus of claim 13, wherein the plurality of decoders is indexed by encoder identifiers for facilitating decompressing process.

15. The apparatus of claim 13, wherein the decoding circuit identifies an encoder identifier from a received data stream.

16. The apparatus of claim 13, wherein the decoding circuit generates decompressed data in accordance with the decoder retrieved from the decoder database.

17. The apparatus of claim 16, wherein the decoding circuit passes the decompressed data to the output circuit.

18. The apparatus of claim 13, wherein the output circuit is capable of outputting vector data via a decompressing process.

19. The apparatus of claim 13, further comprising a transmitter coupled to the decoding circuit and able to receive a data stream containing one of scalar data and vector data.

20. The apparatus of claim 19, wherein the transmitter is configured to generate a data stream containing compressed data and an identifier for transmission.

21. The apparatus of claim 19, wherein the transmitter includes a probability distribution function ("PDF") computation circuit configured to calculate a PDF associated with the data stream.

22. The apparatus of claim 19, wherein the transmitter includes a matching circuit configured to match a probability distribution function ("PDF") to PDF templates to determine a closest matching PDF template.

23. The apparatus of claim 19, wherein the transmitter includes a matching circuit configured to determine an encoder corresponding to a closest matching probability distribution function ("PDF") template wherein a corresponding encoder identifier is determined.

24. The apparatus of claim 19, wherein the transmitter includes an encoding circuit configured to encode the data stream to generate an encoded stream.

25. The apparatus of claim 24, wherein the encoding circuit is configured to transmit the encoded stream and the encoder identifier over at least one of a wired link and a wireless link.

26. The apparatus of claim 19, wherein the transmitter includes an encoding circuit transmits the encoded stream and the encoder identifier.

27. The apparatus of claim 19, wherein the transmitter includes a database for storing probability distribution function ("PDF") templates.

28. The apparatus of claim 19, further comprising a matching circuit configured to access a local database to obtain probability distribution function ("PDF") templates.

29. The apparatus of claim 28, wherein the matching circuit is configured to match the PDF to the PDF templates using KL (Kullback-Leibler) divergence to determine a closest matching PDF template.

30. The apparatus of claim 13, further comprising a communication channel coupled to the decoding circuit and operable to transport the compressed stream.

31. A method for data compression during network communication, comprising:
calculating a probability distribution function ("PDF") for scalar data;
matching the PDF to PDF templates via KL (Kullback-Leibler) divergence for determining a closest matching PDF template;
determining an encoder corresponding to the closest matching PDF template;
identifying an encoder identifier in response to the matching PDF template; and
generating an encoded stream in accordance with the scalar data utilizing the matching PDF template and transmitting the encoded stream and the encoder identifier through one of fifth and higher generation of wireless networks.

32. The method of claim 31, further comprising encoding the scalar data utilizing the encoder to generate an encoded stream.

33. The method of claim 31, further comprising transmitting an encoded stream and the encoder identifier to a receiver.

34. The method of claim 31, wherein determining the encoder includes determining an entropic encoder corresponding to the closest matching PDF template.

35. The method of claim 31, further comprising receiving the encoded stream and the encoder identifier by a receiver, determining a decoder based on the encoder identifier; and
decoding the encoded stream using the decoder to obtain the scalar data.

36. The method of claim 31, further comprising determining a decoder based on the encoder identifier.

37. The method of claim 31, further comprising decoding the encoded stream using the decoder to obtain the scalar data.

38. An apparatus for data processing via network communication, comprising:
means for receiving a data stream of compressed data and an encoder identifier by a receiver via one of fifth and higher generation of wireless communication networks;
means for determining a decoder database storing multiple decoders in the receiver and means for retrieving a decoder from the decoder database in response to the encoder identifier; and
means for decompressing the compressed data in accordance with the decoder for generating scalar data.

39. The apparatus of claim 38, further comprising means for transmitting the data stream containing scalar data in a compressed format and the encoder identifier.

40. The apparatus of claim 38, wherein means for determining a decoder includes means for determining an entropic decoder corresponding to the encoder identifier.

* * * * *